(12) United States Patent
Bietti et al.

(10) Patent No.: US 7,656,239 B2
(45) Date of Patent: Feb. 2, 2010

(54) PHASE SHIFTING COUPLING TECHNIQUE FOR MULTI-PHASE LC TANK BASED OSCILLATORS

(75) Inventors: Ivan Bietti, Casalromano (IT); Riccardo Tonietto, Piacenza (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 397 days.

(21) Appl. No.: 11/155,877

(22) Filed: Jun. 17, 2005

(65) Prior Publication Data
US 2006/0055472 A1 Mar. 16, 2006

(30) Foreign Application Priority Data
Jun. 17, 2004 (WO) .................. PCT/IT2004/000348

(51) Int. Cl.
*H03B 27/00* (2006.01)
*H03B 5/12* (2006.01)
(52) U.S. Cl. .................. 331/45; 331/57; 331/108 B; 331/117 FE
(58) Field of Classification Search .................. 331/45, 331/50, 46, 117 FE, 117 R, 57, 108 B, 135; 327/268, 290
See application file for complete search history.

(56) References Cited

U.S. PATENT DOCUMENTS

| | | | | |
|---|---|---|---|---|
| 4,799,028 A | * | 1/1989 | Weaver et al. | 331/57 |
| 4,994,763 A | * | 2/1991 | Chen et al. | 331/57 |
| 5,420,547 A | * | 5/1995 | Kikuchi | 331/57 |
| 6,175,285 B1 | * | 1/2001 | Gabara | 331/117 R |
| 6,737,926 B2 | * | 5/2004 | Forbes | 331/57 |
| 6,791,423 B2 | * | 9/2004 | Leenaerts et al. | 331/113 R |
| 6,870,432 B2 | * | 3/2005 | Li et al. | 331/46 |
| 6,987,425 B1 | * | 1/2006 | Sutardja | 331/117 R |
| 7,005,930 B1 | * | 2/2006 | Kim et al. | 331/46 |
| 7,336,135 B2 | * | 2/2008 | Higashi et al. | 331/108 B |

* cited by examiner

*Primary Examiner*—Robert Pascal
*Assistant Examiner*—Levi Gannon
(74) *Attorney, Agent, or Firm*—Kevin D. Jablonski; Graybeal Jackson LLP (57) ABSTRACT

A multi-phase oscillator is provided. Said multi-phase oscillator includes a plurality of resonator stages series-connected in an ordered closed loop. Each stage is used for providing one or more oscillating voltages corresponding to an oscillating current. The oscillating current includes a natural current that is generated by the stage and one or more injected currents from a previous stage in the closed loop. The oscillating voltages provided by all the stages have substantially the same frequency; on the other hand, the oscillating voltages provided by each stage and the previous oscillating voltages provided by the previous stage have a corresponding phase difference. The oscillator further includes a coupler between each stage and the previous stage; the coupler is used for generating the injected currents according to the previous oscillating voltages. The coupler includes transconductance means for transforming one or more voltages corresponding to the previous oscillating voltages into one or more currents corresponding to the injected currents; the coupler further includes shifting means for shifting the phase of the injected currents according to the corresponding phase difference. The shifting means includes filtering means for filtering the previous oscillating voltages into one or more corresponding filtered oscillating voltages to be supplied to the transconductance means.

25 Claims, 6 Drawing Sheets

PHASE SHIFTING COUPLING TECHNIQUE FOR MULTI-PHASE LC TANK BASED OSCILLATORS

PRIORITY CLAIM

This application claims priority from PCT/IT2004/00348 (now withdrawn), filed Jun. 17, 2004, which is incorporated herein by reference.

TECHNICAL FIELD

The present invention relates generally to the signal synthesis field. More specifically, the present invention relates to multi-phase oscillators.

BACKGROUND

The synthesis of different signals is commonplace in several applications. A typical example is the generation of multiphase clock signals by means of a Phase Locked Loop (PLL). The purpose of multiphase clock synthesizers based on PLL structures is the production of a high frequency clock signal with several phases (ideally evenly spaced in time), starting from a low frequency single phase reference clock. Typical applications of such PLLs are, for example, the internal base generation in oversampling data recovery circuits.

The core of the above-described PLLs is a harmonic N-phases Voltage Controlled Oscillator (VCO). The VCO consists of N single ended, or N/2 differential, identical stages connected in a ring, wherein each stage is based on an LC tank.

Harmonic VCOs are generally preferred to ring or relaxation VCOs in all those applications where phase noise requirements (i.e., "phase jitter" in the time domain) are very strict. The phase noise performances of a harmonic VCO are better than the ones of a ring or relaxation VCO, because the energy stored in the reactive elements of the LC tanks is typically much higher than the energy required to sustain the oscillations; since the ratio between said two energies equals the quality factor Q of the resonator, the harmonic VCO has a high quality factor that is much higher than unity (while in the other cases this ratio is close to unity).

However, providing clock signals with several evenly spaced phases using harmonic VCOs is more difficult than providing them with ring or relaxation VCOs. The major difficulties reside in the design of couplers that connect adjacent stages in the ring.

One of the simplest couplers known in the art is a differential pair that receives the clock signal generated by an adjacent stage and injects a corresponding current into the associated stage. A disadvantage of this solution is that the current injected by each coupler into its stage has a phase difference with respect to the clock signal that the stage itself has to generate. This implies that each stage is forced to work out of its maximum quality factor range, thereby degrading the phase noise performances.

A method for resolving this problem consists of lowering the module of the injected current, so as to reduce the effect of the phase difference on the generated clock signal. However, this solution may weaken the coupling between the stages, thus involving a low accuracy of the phase spacing between the different clock signals.

A more effective method is to shift the phase of the injected current by an amount such as to reduce its phase difference. In this way, the aforementioned drawbacks are mitigated without lowering the coupling effect.

According to a solution known in the art, the coupler includes a phase shifter that shifts the phase of the injected current by means of a high-pass filter implemented with a capacitive degenerated differential pair. However, the injected current thus provided includes a series of unwanted pulses generated by the high frequency harmonics that the high-pass filter enhances.

A different solution that avoids this drawback is based on a low-pass filter, which is implemented by means of a differential cascode pair. In this case, however, the phase difference often can only be reduced by a small amount (for example 10-20 degrees), and even this small amount may be difficult to control. Moreover, the use of a differential cascode pair necessitates a high-voltage power supply for allowing the correct voltage swing of the clock signals.

SUMMARY

An embodiment of the present invention proposes a solution that is based on the idea of shifting the voltages controlling the injected currents.

Particularly, an embodiment of the present invention provides a multi-phase oscillator including a plurality of resonator stages series-connected in an ordered closed loop. Each stage is used for providing one or more oscillating voltages corresponding to an oscillating current. The oscillating current includes a natural current that is generated by the stage and one or more injected currents from a previous stage in the closed loop. The oscillating voltages provided by all the stages have substantially the same frequency; on the other hand, the oscillating voltages provided by each stage and the oscillating voltages provided by the previous stage have a corresponding phase difference. The oscillator further includes a coupler between each stage and the previous stage; the coupler is used for generating the injected currents according to the previous oscillating voltages. The coupler includes transconductance means for transforming one or more voltages corresponding to the previous oscillating voltages into one or more currents corresponding to the injected currents; the coupler further includes shifting means for shifting the phase of the injected currents according to the corresponding phase difference. The shifting means includes filtering means for filtering the previous oscillating voltages into one or more corresponding filtered oscillating voltages to be supplied to the transconductance means.

According to an embodiment of the present invention, the filtering means includes low-pass filtering means.

According to a further embodiment of the invention, the low pass-filtering means are RC filters.

According to a further embodiment of the present invention, each RC filter includes a resistor and a parasitic capacitance.

According to a further embodiment of the invention, the stages and the couplers have a differential structure.

According to an embodiment of the present invention, the transconductance means includes two MOS transistors, each one having the gate terminal connected to the resistor of the corresponding RC filter, and the gate-to-source parasitic capacitance representing the capacitance of the same RC filter.

Preferably, the module of each injected current is higher than the module of the corresponding natural current.

Another aspect of the present invention provides a Phase Locked Loop including the multi-phase oscillator described above.

A further aspect of the present invention provides a clock and data recovery system with an Oversampling architecture including this Phase Locked Loop.

Another aspect of the present invention provides a corresponding method for generating one or more oscillating voltages.

BRIEF DESCRIPTION OF THE DRAWINGS

Embodiments of the invention, however, as well as further features and advantages thereof, will be best understood by reference to the following detailed description, given purely by way of a non-restrictive indication, to be read in conjunction with the accompanying drawings.

DETAILED DESCRIPTION

Figure 1:
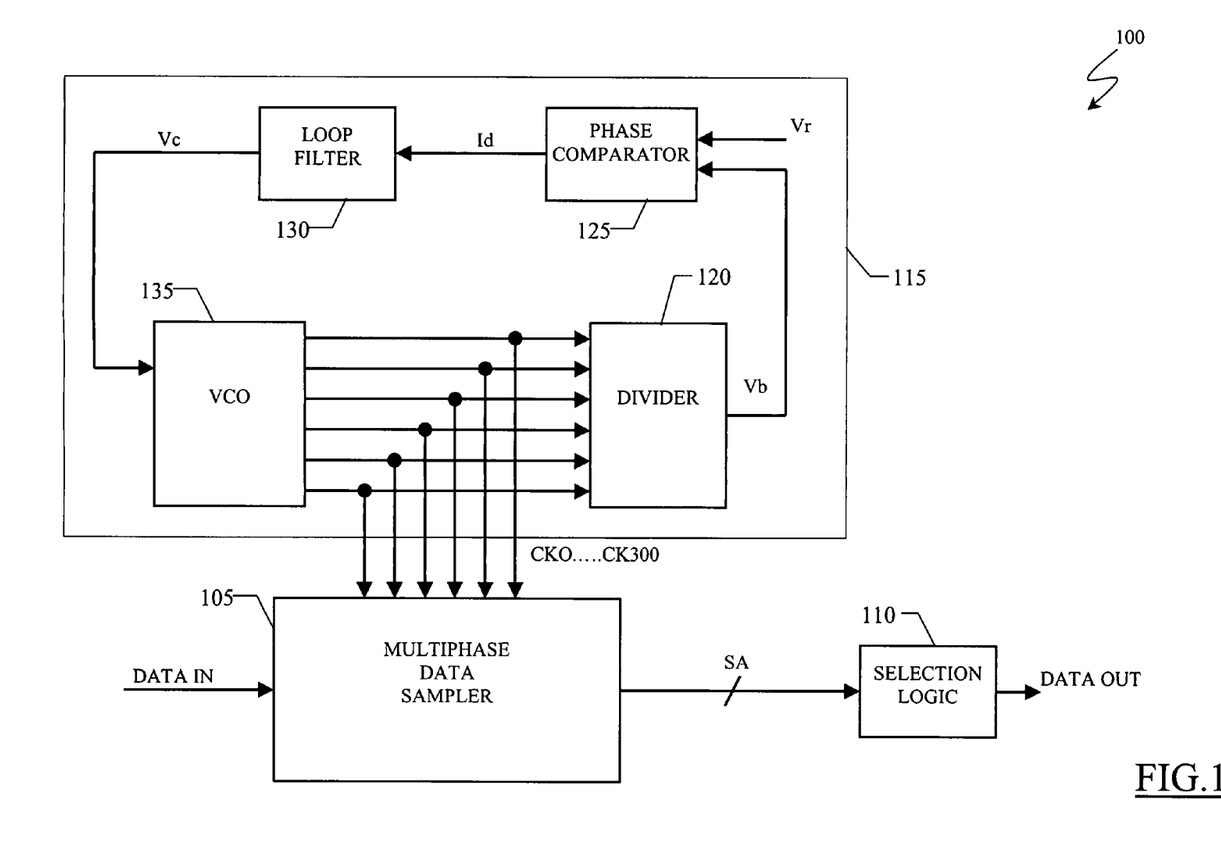
FIG. 1 is a schematic block view of an exemplary oversampling clock and data recovery system including a phase locked loop, according to an embodiment of the present invention.

With reference in particular to FIG. 1, an exemplary Oversampling Clock and Data Recovery (CDR) system 100 is shown according to an embodiment of the invention. A digital data stream DATAIN (from a transmission device not shown in FIG. 1) is provided to a multiphase data sampler 105, that in the example at issue further receives six clock signals ck0, ck60, ck120, ck180, ck240, ck300 with the same high frequency, and with phases evenly spaced in time. The block 105 samples the incoming data stream DATAIN using all the six clock signals ck0-ck300 as sampling signals, in this way obtaining six data samples SA per each time period of the clock signals. The six data samples SA are provided to a selection logic block 110. The selection logic block 110 is capable to efficiently reconstruct the transmitted digital data stream DATAIN, i.e., to retrieve the bit values and to detect the bit transitions thereof; particularly, the selection logic block 110 selects one data sample in every set of the six received data samples SA according to a decision process of elimination, that will not be described in the following because it is not relevant to this discussion.

A digital PLL 115 is used to synthesise the six clock signals ck0-ck300 with the desired high frequency (e.g., Fo equal to several GHz) and phase difference ($\Delta\phi=\frac{2}{3}*360$ degrees in this case), starting from a single low-frequency reference clock signal Vr. The desiderated high-frequency Fo for the clock signals ck0-ck300 is obtained by multiplying a frequency Fr of the reference clock signal Vr by a selected conversion factor N; the reference clock signal Vr is generated by a quartz oscillator (not shown in FIG. 1), which provides a stable and accurate time base.

The PLL 115 implements a feedback loop through a frequency divider 120 that receives the clock signals ck0-ck300. The frequency divider 120 provides a single feedback signal Vb of frequency Fb=Fo/N (for example, in phase with a selected one of the clock signals ck0-ck300). The feedback signal Vb is fed back to a phase comparator 125.

The block 125 compares the feedback signal Vb with the reference clock signal Vr. The phase comparator 125 outputs a control current Id indicative of the phase difference between the two signals, which current Id is injected into a loop filter 130. The loop filter 130 removes the high-frequency components of the control current Id; moreover, it integrates the control current Id into a corresponding voltage Vc. The control voltage Vc drives a multi-phase voltage controlled oscillator (VCO) 135, which provides the clock signals ck0-ck300 accordingly (for the divider 120). Said clock signals ck0-ck300 are also made available to the outside of the PLL 115 by means of driver circuits that are not shown in FIG. 1.

During operation of the PLL 115, the VCO 135 starts oscillating at a free-run frequency as a consequence of background noise in the circuit.

In an unlock condition (such as during an initial power up), the frequency Fb of the feedback signal Vb is different from the frequency Fr of the reference signal Vr. Therefore, the phase comparator 125 outputs a corresponding control current Id. The resulting control voltage Vc (from the loop filter 130) changes the frequency Fo of the clock signals ck0-ck300 accordingly. Particularly, when the feedback frequency Fb is lower than the reference frequency Fr, the control voltage Vc instructs the VCO 135 to increase the frequency Fo; conversely, when the feedback frequency Fb is higher than the reference frequency Fr, the control voltage Vc instructs the VCO 135 to reduce the frequency Fo.

After a transient period, the frequency Fb of the feedback signal Vb reaches the frequency Fr of the reference signal Vr. In this lock condition, the frequency Fo of the clock signals ck0-ck300 is thus equal to Fr*N.

Figure 2:
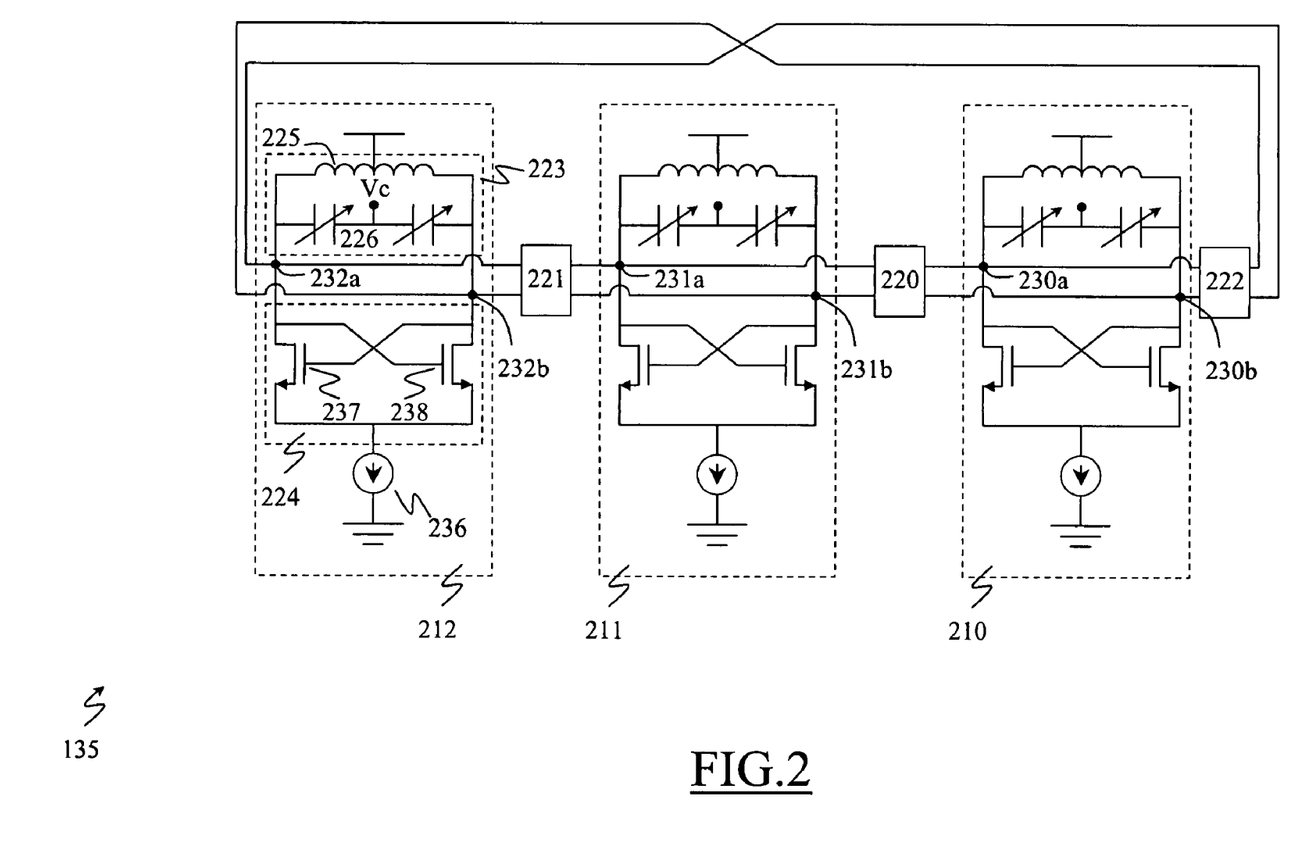
FIG. 2 is a circuital view of a voltage controlled oscillator, included in the phase locked loop, according to an embodiment of the present invention.

With reference now to FIG. 2, the structure of the VCO 135 is illustrated according to an embodiment of the invention. In the example at issue, the VCO 135 is of a six phases (three differential) LC tank ring type. The VCO 135 consists of three equal differential stages 210, 211, 212 arranged in a closed loop by means of corresponding couplers 220, 221, 222, which connect the stages 210, 211, 212 but maintain the correct phase differences and provide a good quality factor of the clock signals generated, as it will be apparent in the following.

More particularly, the stage 210 has two circuital nodes 230a and 230b, the stage 211 has two circuital nodes 231a and 231b, and the stage 212 has two circuital nodes 232a and 232b. The nodes 230a and 230b of the stage 210 are connected to the corresponding nodes of the next stage 211 in the loop (nodes 231a and 231b) by means of the respective coupler 220. The coupler 220 controls the interaction of the stage 210 with the next stage 211. For this purpose, as it will be more clear in the following, the coupler 220 receives the voltages provided by the nodes 230a and 230b and generates two corresponding currents to be injected into the nodes 231a and 231b. Similarly, the nodes 231a and 231b of the stage 211 are connected to the corresponding nodes of the stage 212 (nodes 232a and 232b) by means of the respective coupler 221. Finally, the nodes 232a and 232b of the stage 212 are cross-connected to the nodes 230b and 230a of the stage 210 by means of the respective coupler 222.

For the detailed description of the VCO 135, reference will be made to the stage 212, responsible of the generation of the clock signal ck0 and of the clock signal ck180 (similar considerations apply to the other stages 210 and 211).

The stage 212 includes an LC tank 223 and a negative transconductance amplifier 224. The LC tank 223 is composed of a shunt-connection between an inductor 225 (with an inductance equal to L) and a varactor 226 (with a variable capacitance equal to C). Said shunt-connection forms the two circuital nodes 232a and 232b, wherein the clock signals ck0 (node 232a) and ck180 (node 232b) are made available. The resonance frequency of the LC tank 223 is:

$$Fo = \frac{1}{2\pi\sqrt{LC}}.$$

The tuning capability of the LC tank 223 is provided by the varactor 226, that exhibits a voltage dependant capacitance C; for this purpose, the varactor 226 includes a terminal for receiving the control voltage Vc. By controlling the capacitance C via the control voltage Vc, the resonant frequency Fo (and thus, the frequency of the clock signals ck0 and ck180) can be updated so as to stabilize and lock the PLL at the desired frequency. The energy losses of the LC tank 223 are compensated by the negative transconductance amplifier 224, which is supplied by a current generator 236. The negative transconductance amplifier 224 is realized by means of a cross-coupled differential pair (formed by two NMOS transistors 237, 238). More particularly, the source terminals of both the NMOS transistors 237, 238 are connected to a terminal of the current generator 236 (another terminal of the current generator 236 is connected to a terminal providing a reference voltage, or ground); the drain terminal of the NMOS transistor 237 is connected to the node 232a, and the drain terminal of the NMOS transistor 238 is connected to the node 232b. Finally, the gate terminal of the NMOS transistor 237 is connected to the node 232b, while the gate terminal of the NMOS transistor 238 is connected to the node 232a. Said negative transconductance amplifier 224 acts as a negative resistor thanks to its positive feedback.

According to the differential structure of the stage 212, the two clock signals ck0 and ck180 are in phase-opposition, that is, they have a phase difference of 180 degrees.

The stages 220, 221, 222 are substantially equal to each other and then oscillate at the same frequency Fo. Thanks to the closed-loop configuration (with the above-mentioned cross-connection) and to the presence of the couplers 220, 221 and 222, the VCO 135 is in a position to generate six clock signals with phases ideally evenly spaced in time. More particularly, taking the clock signal ck0 synthesized at the node 232a as a phase reference, the clock signal ck180 synthesized at the node 232b has a phase difference of 180 degrees with respect to the clock signal ck0, the clock signal ck240 synthesized at the node 231a has a phase difference of 240 degrees, the clock signal ck60 synthesized at the node 231b has a phase difference of 60 degrees, the clock signal ck120 synthesized at the node 230a has a phase difference of 120 degrees, and the clock signal ck300 synthesized at the node 230b has a phase difference of 300 degrees.

Figure 3A:
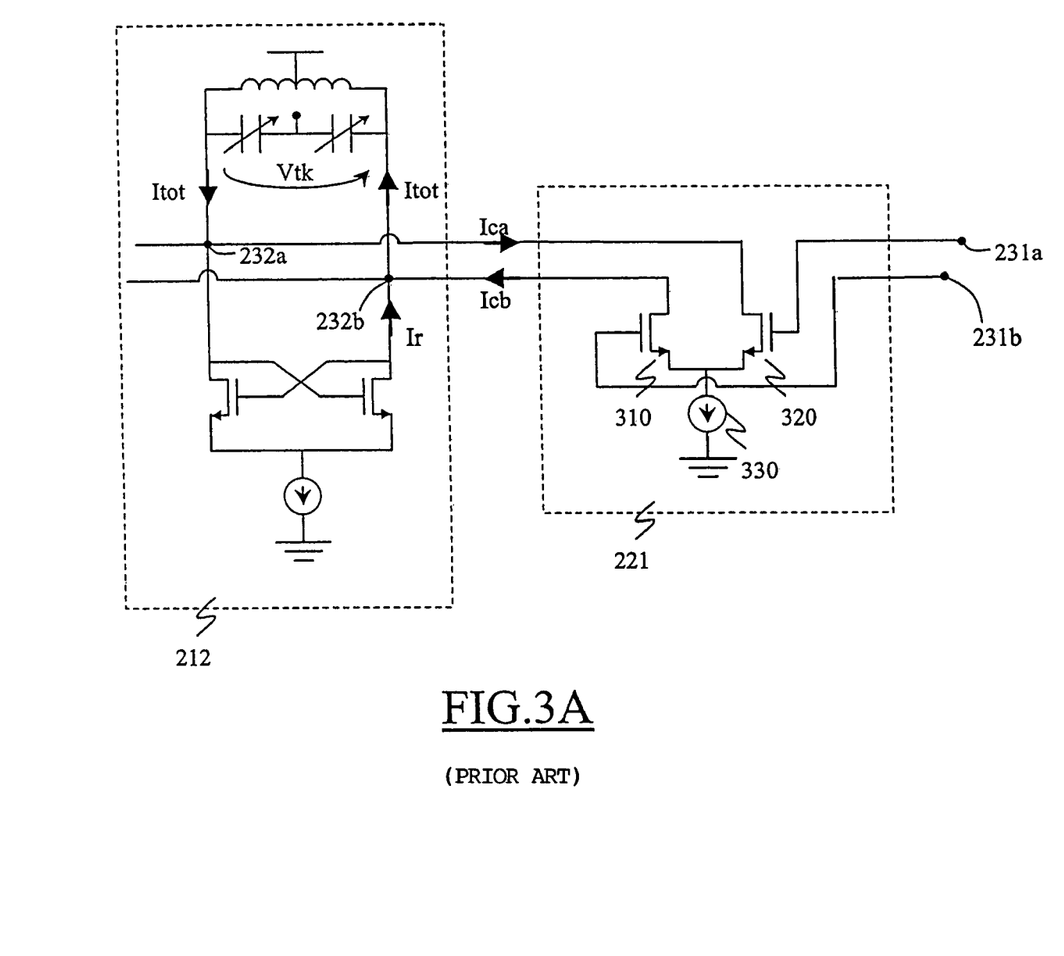
FIG. 3A illustrates a circuital implementation of a coupler included in the voltage controlled oscillator shown in the FIG. 2, according to a solution known in the art.

Referring to FIG. 3A, a detailed view of the coupler 221 is illustrated according to a simple solution known in the art. In this case, the coupler 221 includes a transconductance amplifier, which is based on a differential pair composed of two NMOS transistors 310 and 320, biased by means of a current generator 330. More particularly, the drain terminal of the NMOS transistor 310 is connected to the node 232b, and its gate terminal is connected to the node 231b. Likewise, the drain terminal of the NMOS transistor 320 is connected to the node 232a, and its gate terminal is connected to the node 231a. The source terminals of the NMOS transistors 310, 320 are connected together to a first terminal of the current generator 330 (another terminal of the current generator 330 is connected to the ground terminal). The voltage at the node 231a, i.e., the clock signal ck240, drives the gate terminal of the NMOS transistor 320, so as to generate a corresponding coupling current Ica (i.e., its drain current, that is a function of the voltage at the gate terminal). The coupling current Ica is then injected into the node 232a. The nodes 231b and 232b are coupled in the same way, with a coupling current Icb provided by the NMOS transistor 310 that is ideally equal to the coupling current Ica with a phase difference of 180 degrees (thanks to the symmetrical structure of the differential pair).

Figure 3B:
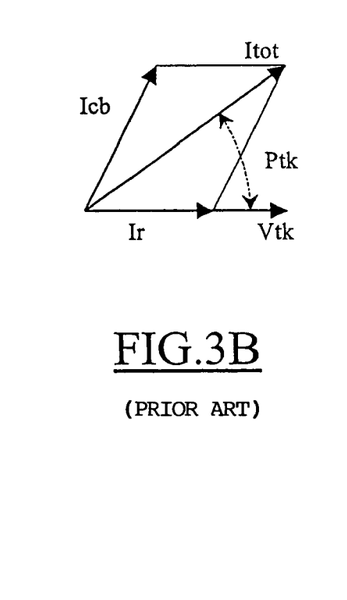
FIG. 3B shows the phasors of currents and voltages of the coupler illustrated in FIG. 3A.

This solution implies the production of a high phase noise (in the form of random jitters) disturbing the generation of the clock signals ck0, ck180. To explain the reason of such generation of phase noise, it is necessary to describe the LC tank 223 behavior in terms of its impedance, referring to the FIGS. 3A and 3B together. The LC tank 223 receives a total current Itot from the node 232b, given by the sum of the coupling current Icb injected by the coupler 221 and of a regenerating (or natural) current Ir provided by the negative transconductance amplifier 224. The same total current Itot is then returned from the node 232a to the negative transconductance amplifier 224 (regenerating current Ir) and to the coupler 211 (coupling current Ica). Defining with Vtk the tank voltage between the nodes 232a and 232b, it is simple to show that the regenerating current Ir is in-phase with the voltage Vtk. If the coupling current Icb was zero (i.e., if the stage 212 was disconnected from the previous one), the current Itot flowing into the LC tank would be equal to the regenerating current Ir. Conversely, the phase of the coupling current Icb provided by the node 231b is given by the phase of the clock signal ck60 (having a phase difference of 60 degrees with respect to the phase of the clock signal ck0), plus the phase difference introduced by the NMOS transistor 310 (i.e., 180 degrees): therefore, the coupling current Icb has a phase difference of 240 degrees with respect to the clock signal ck0. In other words, the coupling current Icb "leads" the voltage Vtk by 240−180=60 degrees. As can be seen in the FIG. 3B, the resulting total current Itot has a phase difference Ptk with respect to the voltage Vtk that may be not negligible. As a consequence, the imaginary part of the LC tank 223 impedance at the resonant frequency Fo is relatively low. This operating condition is not optimal for the phase noise performances, since the effective quality factor of the stage is lower than its peak value, i.e, the total energy stored in the LC tank 223 is not maximum for a given power consumption.

Figure 4A:
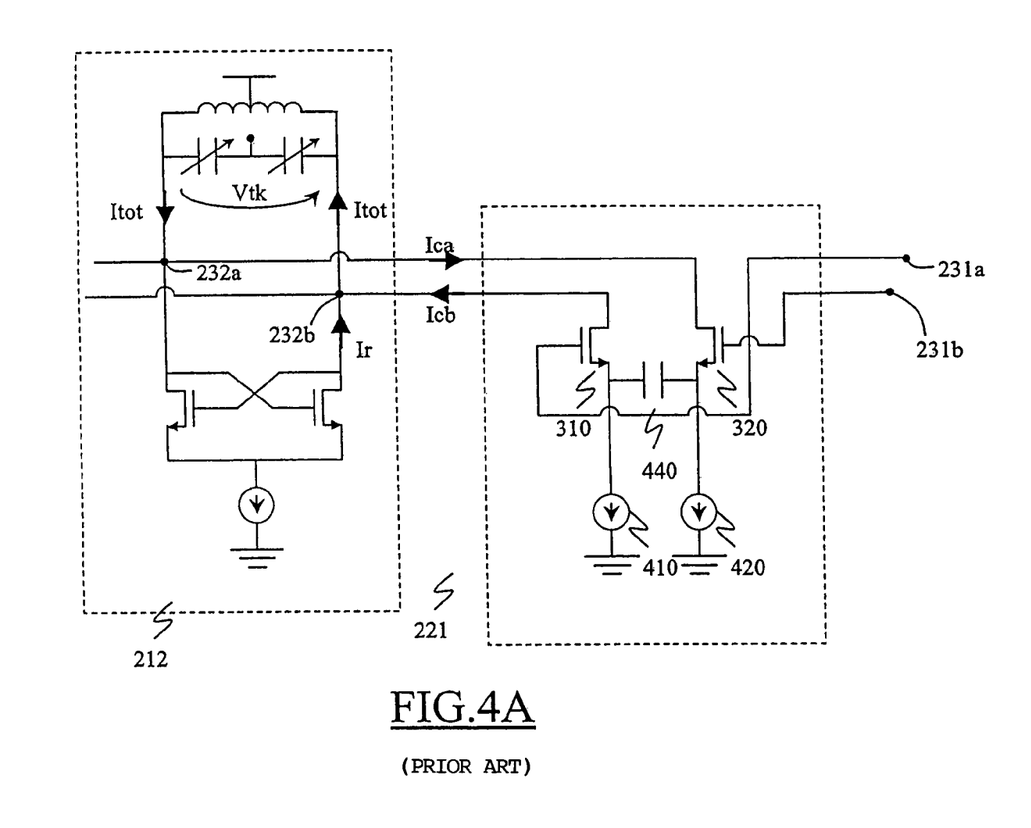
FIG. 4A illustrates a circuital implementation of a coupler included in the voltage controlled oscillator shown in the FIG. 2, according to a further solution known in the art.
Figure 4B:
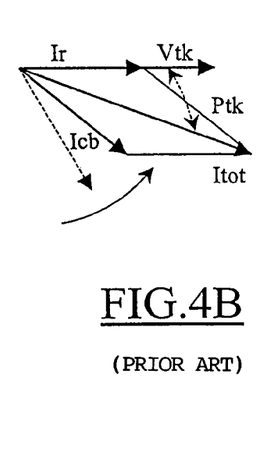
FIG. 4B shows the phasors of currents and voltages of the coupler illustrated in FIG. 4A.

Referring now to the FIG. 4A, a detailed view of the coupler 221 is illustrated according to a further solution known in the art (from now on, all the elements corresponding to the ones shown in the FIG. 3A will be denoted with the same references, and their explanation will be omitted for the sake of brevity). In this case, the coupler 221 includes a capacitive degenerated differential pair composed by the two NMOS transistors 310, 320 (biased by two current generators 410, 420) and a capacitor 440. More particularly, this circuital structure differs from the one described previously in that the source terminal of the NMOS transistor 310 is connected to a terminal of the current generator 410, and the source terminal of the NMOS transistor 320 is connected to a terminal of the current generator 420 (the other terminals of the current generators 410, 420 are connected to the ground terminal). The capacitor 440 is connected between the source terminals of the NMOS transistors 310 and 320. Moreover, the connections of the gate terminals of the NMOS transistors 310 and 320 are inverted, with the gate terminal of the NMOS transistor 310 that is connected to the node 231a and the gate terminal of the NMOS transistor 320 that is connected to the node 231b. The presence of the capacitor 440 allows considerably reducing the phase noise affecting the generation of the clock signals with respect to the case illustrated in the FIG. 3A. In fact, referring to FIG. 4B, it is possible to show that the capacitor 440 shifts the phase of the injected coupling current Icb in such a way to reduce the phase difference Ptk between the resulting total current Itot and the voltage Vtk. More particularly, disregarding the capacitor 440 for the time being, the coupling current Icb (shown in dotted line) "lags" the voltage Vtk by 60 degrees (because of the inverted connections between the gate terminals of the NMOS transistors and the nodes 231a and 231b). Conversely, thanks to its presence, the capacitor 440, acting as a "current-derivator", anticipates the coupling current Icb towards the voltage Vtk.

This solution has a substantial drawback, which is represented by the capacitor 440 itself. In fact, the capacitor 440 also acts as a high pass filter; therefore, the equivalent transconductance value of the capacitive degenerated differential pair is higher in correspondence to the frequencies of the higher harmonics components of the coupling currents Ica, Icb than in correspondence to the desired resonant frequency Fo. Consequently, the coupling currents Ica and Icb exhibit a series of pulses (instead of being ideal sinusoids).

Figures 5A, 5B:
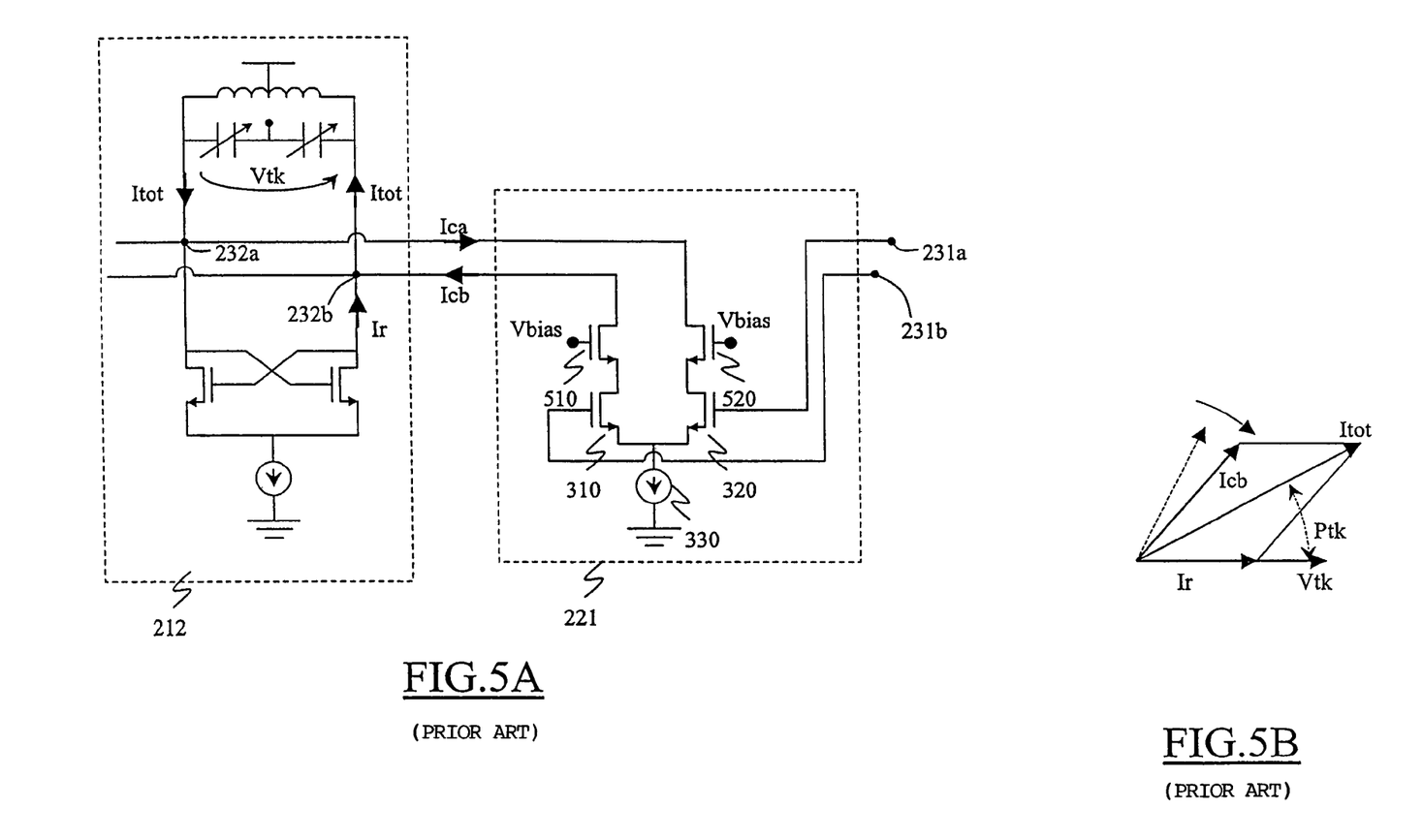
FIG. 5A illustrates a circuital implementation of a coupler included in the voltage controlled oscillator shown in the FIG. 2, according to another solution known in the art.
FIG. 5B shows the phasors of currents and voltages of the coupler illustrated in FIG. 5A.

Referring now to the FIG. 5A, a detailed view of the coupler 221 is illustrated according to a further solution known in the art. In this case, the coupler 221 includes a differential pair composed by the two NMOS transistors 310, 320 having two cascode transistors 510, 520 in series with the drain terminals thereof. More particularly, this circuital structure differs from the one described with reference to FIG. 3A in that the drain terminal of the NMOS transistor 310 is connected to the source terminal of the cascode transistor 510, and the drain terminal of the NMOS transistor 320 is connected to the source terminal of the cascode transistor 520. Moreover, the cascode transistor 510 has the drain terminal connected to the node 232b and the gate terminal connected to a terminal providing a biasing voltage Vbias; likewise, the cascode transistor 520 has the drain terminal connected to the node 232a and the gate terminal connected to a terminal providing the same biasing voltage Vbias. The presence of the cascode transistors 510, 520 allows reducing the phase noise affecting the generation of the clock signals. In fact, the cascode configuration given by the transistors 310, 320, 510 and 520 performs a low-pass filtering action on the coupling current Icb, thereby removing its unwanted high harmonic components and generating a corresponding phase delay. As shown in FIG. 5B, said phase delay is capable of reducing the phase difference Ptk between the resulting total current Itot and the voltage Vtk (and then considerably increasing the imaginary part of the LC tank 223 impedance at the resonant frequency Fo).

As pointed out above, the phase difference so obtained is relatively low and difficult to control (since it strongly depends on the design of the cascode transistors 510, 520). In any case, those cascode transistors 510, 520 adversely affect the voltage swing of the clock signals (thereby requiring a high power supply).

Figure 6A:
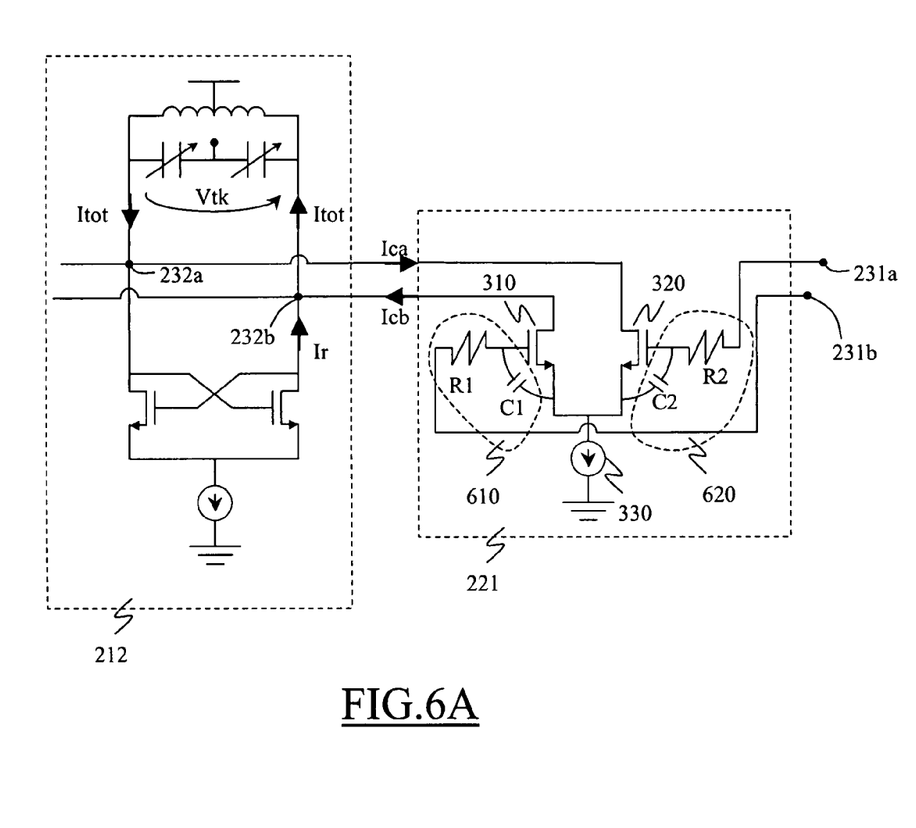
FIG. 6A illustrates a circuital implementation of a coupler included in the voltage controlled oscillator shown in the FIG. 2, according to an embodiment of the present invention.

Referring now to the FIG. 6A, a detailed view of the coupler 221 is illustrated according to an embodiment of the present invention. In this case, the coupler 221 includes two passive RC low-pass filters 610, 620 series-connected to the gate terminals of the NMOS transistors 310, 320. More particularly, this circuital structure differs from the one described with reference to FIG. 3A in that it includes a resistor R1 having a first terminal connected to the node 231b and a second terminal connected to the gate terminal of the NMOS transistor 310, and a resistor R2 having a first terminal connected to the node 231a and a second terminal connected to the gate terminal of the NMOS transistor 320. The low pass filter 610 consists of the resistor R1 and of a capacitance C1, which is the gate to source parasitic capacitance of the NMOS transistor 310. Similarly, the low pass filter 620 consists of the resistor R2 and of a capacitance C2, which is the gate to source parasitic capacitance of the NMOS transistor 320.

Figure 6B:
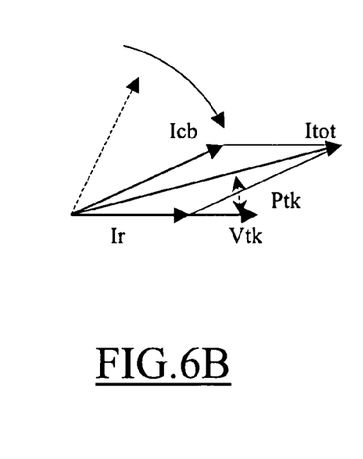
FIG. 6B shows the phasors of currents and voltages of the coupler illustrated in FIG. 6A according to an embodiment of the invention.

Contrarily to the cases previously described, the phase shifts of the coupling currents Ica, Icb are now obtained by means of delaying operations performed on voltages instead of on the coupling currents. More particularly, referring to the coupling current Icb, the low pass filter 610 receives the clock signal ck240 from the node 231a, delays it, and provides said delayed clock signal to the gate terminal of the NMOS transistor 310. In this way, the corresponding coupling current Icb generated by the NMOS transistor 310 has its phase that is already shifted towards the voltage Vtk in such a way to reduce the phase difference to within approximately 20 degrees. In other embodiments, this phase difference may be reduced by different amounts, such as to within approximately thirty-nine degrees or other desirable amounts. Similar considerations apply to the coupling current Ica (FIG. 6B).

The low pass filters 610 and 620 allow setting the phase shift of the coupling currents Ica, Icb in a simple manner, by trimming the resistors R1 and R2. Moreover, the filtering effect of the low pass filters 610 and 620 involves that the generated coupling currents Ica, Icb are converted from the corresponding clock signals mainly at the oscillation frequency Fo, and not at their higher harmonic frequencies. Consequently, it is possible to obtain a strong coupling effect between each stage and the adjacent one, and thus high phase accuracies. With respect to the structure described in the FIG. 5A, the proposed solution allows reaching higher reductions of the phase difference Ptk (up to 40-50 degrees), using a simpler circuital architecture. In fact, the cascode structure of FIG. 5A needs the introduction of two cascode transistors 510, 520 that necessitate biasing lines providing the biasing voltage Vbias, thus involving routing complications. Conversely, the proposed solution involves the introduction of only two resistors, without the need of further biasing lines. Moreover, the proposed solutions is adapted to be used with low voltage supplies, contrarily to the cascode structure of FIG. 5A, which necessitates a voltage supply sufficiently high for the series connected transistors 310, 510 and 320, 520.

Naturally, in order to satisfy local and specific requirements, a person skilled in the art may apply to the solution described above many modifications and alterations. Particularly, although the present invention has been described with a certain degree of particularity with reference to embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the oscillator has a different structure or includes equivalent elements; moreover, it is possible to have a different number of stages (with a corresponding phase difference of the clock signals or any other oscillating voltages).

Even though in the preceding description reference has been made to differential stages and differential couplers, the same concepts also apply if they are replaced by single-ended circuits.

It is not excluded that the transconductance amplifier and/or the low-pass filters have a different circuital implementation carrying out the same operations.

Although in the description reference has been made to a PLL for use in a clock and data recovery system, it will be apparent that the proposed solution is of general applicability in any other device requiring the generation of multi-phase voltages.

In any case, nothing prevents the use of high-pass filters too (even if they are far less advantageous because of the drawbacks pointed out in the foregoing).

Moreover, the use of a capacitor added in series to the resistor or across the gate to source junction of the coupling transistor (e.g., 310, 320) is within the scope of the invention.

In any case, it is possible to implement the solution according to an embodiment of the invention even if the injected current is lower than the corresponding natural current.

In addition, the CDR system 100 of FIG. 1 may be implemented on one or more integrated circuits (ICs), and may be part of a larger system that is implemented on one or more ICs.

What is claimed is:

1. A multi-phase oscillator including a plurality of resonator stages series-connected in an ordered closed loop each one for providing at least one oscillating voltage corresponding to an oscillating current including a natural current being generated by the stage and at least one injected current from a previous stage in the closed loop, the oscillating voltages provided by all the stages having substantially the same frequency, and the at least one oscillating voltage provided by each stage and the at least one previous oscillating voltage provided by the previous stage having a corresponding phase difference, wherein the oscillator further includes a coupler between each stage and the previous stage for generating the at least one injected current according to the at least one previous oscillating voltage, the coupler including transconductance means having a current source for transforming at least one voltage corresponding to the at least one previous oscillating voltage into at least one current corresponding to the at least one injected current, and shifting means for shifting the phase of the at least one injected current according to the corresponding phase difference;
wherein the shifting means includes filtering means for filtering the at least one previous oscillating voltage into at least one corresponding filtered oscillating voltage to be supplied to the transconductance means;
wherein the filtering means includes at least one RC filter.

2. The multi-phase oscillator of claim 1, wherein the oscillator has a differential structure with each stage having two oscillating terminals for providing two oscillating voltages in phase opposition, wherein each coupler has two input terminals for receiving two previous oscillating voltages in phase opposition and two output terminals for providing two injected currents in phase opposition, and wherein the at least one RC filter consists of two RC filters.

3. A phase locked loop including a multiphase harmonic voltage controlled oscillator based on the multi phase oscillator of claim 1.

4. A clock and data recovery system with an oversampling architecture including the phase locked loop of claim 3.

5. The multi-phase oscillator of claim 1, wherein the filtering means includes low-pass filtering means.

6. A multi-phase oscillator including a plurality of resonator stages series-connected in an ordered closed loop each one for providing at least one oscillating voltage corresponding to an oscillating current including a natural current being generated by the stage and at least one injected current from a previous stage in the closed loop, the oscillating voltages provided by all the stages having substantially the same frequency, and the at least one oscillating voltage provided by each stage and the at least one previous oscillating voltage provided by the previous stage having a corresponding phase difference, wherein the oscillator further includes a coupler between each stage and the previous stage for generating the at least one injected current according to the at least one previous oscillating voltage, the coupler including transconductance means having a direct-current generator for transforming at least one voltage corresponding to the at least one previous oscillating voltage into at least one current corresponding to the at least one injected current, and shifting means for shifting the phase of the at least one injected current according to the corresponding phase difference;
wherein the shifting means includes filtering means for filtering the at least one previous oscillating voltage into at least one corresponding filtered oscillating voltage to be supplied to the transconductance means;
wherein the transconductance means has at least an input terminal for receiving the at least one filtered oscillating voltage, and wherein each filtering means includes a resistor series-connected to a corresponding input terminal of the transconductance means and a parasitic capacitance of the corresponding input terminal of the transconductance means.

7. A multi-phase oscillator including a plurality of resonator stages series-connected in an ordered closed loop each one for providing at least one oscillating voltage corresponding to an oscillating current including a natural current being generated by the stage and at least one injected current from a previous stage in the closed loop, the oscillating voltages provided by all the stages having substantially the same frequency, and the at least one oscillating voltage provided by each stage and the at least one previous oscillating voltage provided by the previous stage having a corresponding phase difference, wherein the oscillator further includes a coupler between each stage and the previous stage for generating the at least one injected current according to the at least one previous oscillating voltage, the coupler including transconductance means for transforming at least one voltage corresponding to the at least one previous oscillating voltage into at least one current corresponding to the at least one injected current, and shifting means for shifting the phase of the at least one injected current according to the corresponding phase difference;
wherein the shifting means includes filtering means for filtering the at least one previous oscillating voltage into at least one corresponding filtered oscillating voltage to be supplied to the transconductance means;
wherein the filtering means includes at least one RC filter;
wherein the oscillator has a differential structure with each stage having two oscillating terminals for providing two oscillating voltages in phase opposition, wherein each coupler has two input terminals for receiving two previous oscillating voltages in phase opposition and two output terminals for providing two injected currents in phase opposition, and wherein the at least one RC filter consists of two RC filters; and wherein the transconductance means includes two MOS transistors, and wherein:

the source terminals of the two MOS transistors are connected to a direct current generator;

the drain terminal of each MOS transistor is connected to a corresponding oscillating terminal of the stage;

the gate terminal of each MOS transistor is connected to a terminal of the resistor of the corresponding RC filter;

a further terminal of the resistor of each RC filter is connected to a corresponding oscillating terminal of the previous stage; and the capacitance of each RC filter is the gate-to-source parasitic capacitance of the corresponding MOS transistor.

8. A multi-phase oscillator including a plurality of resonator stages series-connected in an ordered closed loop each one for providing at least one oscillating voltage corresponding to an oscillating current including a natural current being generated by the stage and at least one injected current from a previous stage in the closed loop, the oscillating voltages provided by all the stages having substantially the same frequency, and the at least one oscillating voltage provided by each stage and the at least one previous oscillating voltage provided by the previous stage having a corresponding phase difference, wherein the oscillator further includes a coupler between each stage and the previous stage for generating the at least one injected current according to the at least one previous oscillating voltage, the coupler including transconductance means having a direct current generator for transforming at least one voltage corresponding to the at least one previous oscillating voltage into at least one current corresponding to the at least one injected current, and shifting means for shifting the phase of the at least one injected current according to the corresponding phase difference;

wherein the shifting means includes filtering means for filtering the at least one previous oscillating voltage into at least one corresponding filtered oscillating voltage to be supplied to the transconductance means;

wherein the module of each injected current is higher than the module of the corresponding natural current.

9. A method for generating at least an oscillating voltage in a multi-phase oscillator including a plurality of resonator stages series-connected in an ordered closed loop, the oscillating voltages provided by all the stages having substantially the same frequency, and the at least one oscillating voltage provided by each stage and the at least one previous oscillating voltage provided by a previous stage in the closed loop having a corresponding phase difference, wherein for each stage the method includes the steps of:

filtering the at least one previous oscillating voltage into at least one corresponding filtered oscillating voltage using an RC filter;

transforming the at least one filtered oscillating voltage into at least one corresponding injected current from a direct-current generator, the phase of the at least one injected current being shifted according to the corresponding phase;

combining a natural current being generated by the stage with the at least one injected current into an oscillating current; and obtaining the at least one oscillating voltage according to the oscillating current.

10. An oscillator, comprising:

a number of resonant stages each operable to generate a respective signal at a signal node, the signal having a same frequency and a respective phase; and a same number of couplers each disposed between a respective pair of the resonant stages and each having an impendence element including a resistor coupled between a control node of a transistor element and the signal node, and having a current source coupled between a drive node of the transistor and a reference node, the coupler operable to, receive a first signal generated by a first stage of the pair, generate from the first signal a synchronization signal having the same frequency as the first signal and having a synchronization phase that is within approximately thirty nine degrees of a phase of a second signal generated by a second stage of the pair of resonant stages, and couple the synchronization signal to the second stage of the pair.

11. The oscillator of claim 10 wherein each coupler is operable to generate the synchronization signal having a synchronization phase that is within approximately twenty degrees of the phase of the second signal.

12. The oscillator of claim 10 wherein:

each of the resonant stages comprises a differential stage; and each of the couplers comprises a differential coupler.

13. The oscillator of claim 10 wherein the resonant stages are each operable to receive a control signal on which depends the frequency of the signals generated by the resonant stages.

14. An oscillator, comprising:

a number of resonant stages each having a signal node and operable to generate on the node a respective signal having a same frequency and a respective phase; and a same number of couplers each disposed between a respective pair of the resonant stages and including, a transistor having a first drive node coupled to the signal node of a second stage of the pair, a second drive node coupled to a current source, and a control node, and a first impedance element including a resistor coupled between the signal node of a first stage of the pair and the control node of the transistor.

15. The oscillator of claim 14 wherein each of the couplers further includes:

the transistor having a second drive node; and a second impedance element coupled between the control node and the second drive node.

16. The oscillator of claim 15 wherein the second impedance element comprises a parasitic capacitor of the transistor.

17. A phase locked loop, comprising:

a signal controlled oscillator, comprising, a number of resonant stages each operable to receive a control signal and to generate a respective signal at a signal node, the signal having a same frequency and a respective phase, the frequency depending on a parameter of the control signal; and a same number of couplers each disposed between a respective pair of the resonant stages and each having an impendence element including a resistor coupled between a control node of a transistor element and the signal node and having a current source coupled between a drive node of the transistor and a reference node, the coupler operable to, receive a first signal generated by a first stage of the pair, generate from the first signal a synchronization signal having the same frequency as the first signal and having a synchronization phase that is within approximately thirty nine degrees of a phase of a second signal generated by a second stage of the pair of resonant stages, and couple the synchronization signal to the second stage of the pair.

18. A system, comprising:

a phase locked loop, comprising, a signal controlled oscillator, comprising, a number of resonant stages each operable to receive a control signal and to generate a respective signal at a signal node, the signal having a same frequency and a respective phase, the frequency depending on a parameter of the control signal; and a same number of couplers each disposed between a respective pair of the resonant stages and each having an impendence element including a resistor coupled between a control node of a transistor element and the signal node, and having a current source coupled to a drive node of the transistor, the coupler operable to, receive a first signal generated by a first stage of the pair, generate from the first signal a synchronization signal having the same frequency as the first signal and having a synchronization phase that is within approximately thirty nine degrees of a phase of a second signal generated by a second stage of the pair of resonant stages, and couple the synchronization signal to the second stage of the pair.

19. A method, comprising:

generating with a first number of resonant stages a second number of oscillator signals each having a same frequency and a respective phase; and for each adjacent pair of the resonant stages, using an RC filter and a current source to generate from a first oscillator signal generated by a first stage of the pair a synchronization signal having the same frequency as the first oscillator signal and having a synchronization phase that is shifted from the phase of the first oscillator signal by a value approximately equal to three hundred sixty degrees divided by an integer multiple of the first number, and coupling the synchronization signal to the second stage of the pair.

20. The method of claim 19 wherein the integer multiple equals unity.

21. The method of claim 19 wherein the integer multiple equals two.

22. The method of claim 19 wherein the second number equals the first number.

23. The method of claim 19 wherein the second number is twice the first number.

24. A method, comprising:

generating with a first number of resonant stages a second number of oscillator signals each having a same frequency and a respective phase; and using an RC filter and a current source to cause the phase of a first oscillator signal from a first resonant stage to be shifted relative to the phase of a second oscillator signal from a second resonant stage by a value approximately equal to three hundred sixty degrees divided by the second number, the second stage adjacent to the first stage.

25. The method of claim 24 wherein the second number is an integer multiple of the first number.

* * * * *